United States Patent
Yamamoto et al.

(10) Patent No.: US 9,966,524 B2
(45) Date of Patent: May 8, 2018

(54) ULTRASONIC PROBE, PIEZOELECTRIC TRANSDUCER, METHOD OF MANUFACTURING ULTRASONIC PROBE, AND METHOD OF MANUFACTURING PIEZOELECTRIC TRANSDUCER

(71) Applicant: Toshiba Medical Systems Corporation, Otawara-shi (JP)

(72) Inventors: Noriko Yamamoto, Yokohama (JP);
Yohachi Yamashita, Yokohama (JP);
Yasuharu Hosono, Kawasaki (JP);
Kazuhiro Itsumi, Tokyo (JP);
Kazuhiko Higuchi, Kawasaki (JP)

(73) Assignee: Toshiba Medical Systems Corporation, Otawara-shi (JP)

( * ) Notice: Subject to any disclaimer, the term of this patent is extended or adjusted under 35 U.S.C. 154(b) by 632 days.

(21) Appl. No.: 13/975,508

(22) Filed: Aug. 26, 2013

(65) Prior Publication Data
US 2014/0062261 A1    Mar. 6, 2014

(30) Foreign Application Priority Data
Aug. 28, 2012    (JP) .................................. 2012-187427

(51) Int. Cl.
*H01L 41/08*   (2006.01)
*H01L 41/25*   (2013.01)
(Continued)

(52) U.S. Cl.
CPC .......... *H01L 41/0825* (2013.01); *B06B 1/067* (2013.01); *B06B 1/0622* (2013.01);
(Continued)

(58) Field of Classification Search
CPC ..... B06B 1/0622; G10K 11/02; H01L 41/187; H01L 41/18
(Continued)

(56) References Cited

U.S. PATENT DOCUMENTS 6,153,967 A * 11/2000 Kobayashi ............ B06B 1/0622
                                                   310/327
7,402,938 B2    7/2008 Matsushita et al.
(Continued)

FOREIGN PATENT DOCUMENTS

CN    1447455 A    10/2003
CN    1755357 A     4/2006
(Continued)

OTHER PUBLICATIONS

Yang Xiang et al. "Optimization of piezoelectric properties for $[001]_C$ poled 0.94Pb $(Zn_{1/3}Nb_{2/3})O_3$-0.06PbTiO$_3$ single crystals", Applied Physics Letters 96, 092902, 2012, 3 pages.
(Continued)

*Primary Examiner* — Bryan Gordon
(74) *Attorney, Agent, or Firm* — Oblon, McClelland, Maier & Neustadt, L.L.P.

(57) ABSTRACT

According to one embodiment, an ultrasonic probe includes a single crystal piezoelectric body with first and second planes facing each other and having a crystal orientation of [100], first and second electrodes on the respective first and second plane of the piezoelectric body, an acoustic matching layer on the first electrode, and a backing member under the second electrode, wherein the piezoelectric body is polarized along a first direction passing through the piezoelectric body and first and second electrodes, a fracture surface of the piezoelectric body that includes the first direction has a multilayer shape along one of the first and second electrodes, and a thickness of each layer of the multilayer shape is not less than 0.5 μm and not more than 5 μm.

6 Claims, 9 Drawing Sheets

(51) Int. Cl.
*H01L 41/187* (2006.01)
*B06B 1/06* (2006.01)
*H01L 41/18* (2006.01)
*H01L 41/257* (2013.01)
*H01L 41/338* (2013.01)

(52) U.S. Cl.
CPC ............ *H01L 41/18* (2013.01); *H01L 41/187* (2013.01); *H01L 41/25* (2013.01); *H01L 41/257* (2013.01); *H01L 41/338* (2013.01); *Y10T 29/42* (2015.01)

(58) Field of Classification Search
USPC ............................ 310/334, 335, 358; 252/62
See application file for complete search history.

(56) References Cited

U.S. PATENT DOCUMENTS

| | | | | |
|---|---|---|---|---|
| 7,707,701 | B2* | 5/2010 | Iwashita | B41J 2/161 29/25.35 |
| 2003/0178914 | A1* | 9/2003 | Ogawa | H01L 41/1875 310/311 |
| 2005/0275696 | A1* | 12/2005 | Miyazawa | B41J 2/14233 347/72 |
| 2008/0034873 | A1* | 2/2008 | Habu | H01L 41/257 73/632 |
| 2008/0067898 | A1* | 3/2008 | Aoki | B41J 2/14233 310/358 |
| 2008/0312537 | A1* | 12/2008 | Hyuga | B06B 1/0622 600/459 |
| 2009/0062655 | A1* | 3/2009 | Saito | G10K 11/02 600/459 |
| 2009/0236940 | A1* | 9/2009 | Nakayama | B06B 1/064 310/336 |
| 2010/0158283 | A1* | 6/2010 | Kim | H04R 17/00 381/190 |

FOREIGN PATENT DOCUMENTS

| | | |
|---|---|---|
| JP | 46-4710 | 2/1971 |
| JP | 2004-120283 A | 4/2004 |
| JP | 2005-139064 A | 6/2005 |
| JP | 2011-9771 | 1/2011 |

OTHER PUBLICATIONS

Jie Chen et al. "Realizing dramatic improvements in the efficiency, sensitivity and bandwidth of ultrasound transducers", http://www.healthcare.philips.com/pwc_hc/main/shared/Assets/Documents/Ultrasound/Solutions/Technologies/Philips_Pure Wave_crystal_technology. Pdf, 8 pages.

Dabin Lin et al. "Influence of domain size on the scaling effects in $Pb(Mg_{1/3}Nb_{2/3})O_3$-$PbTiO_3$ ferroelectric crystals", Scripta Materialia 64, 2011, 3 pages.

Q.R. Yin et al. "Near-field acoustic and piezoresponse microscopy of domain structures in ferroelectric material", Journal of Materials Science 41, 2006, pp. 259-270.

Japanese Office Action dated May 10, 2016 in Patent Application No. 2012-187427.

Office Action dated Mar. 3, 2017 in Chinese Patent Application No. 201310381638.X.

* cited by examiner

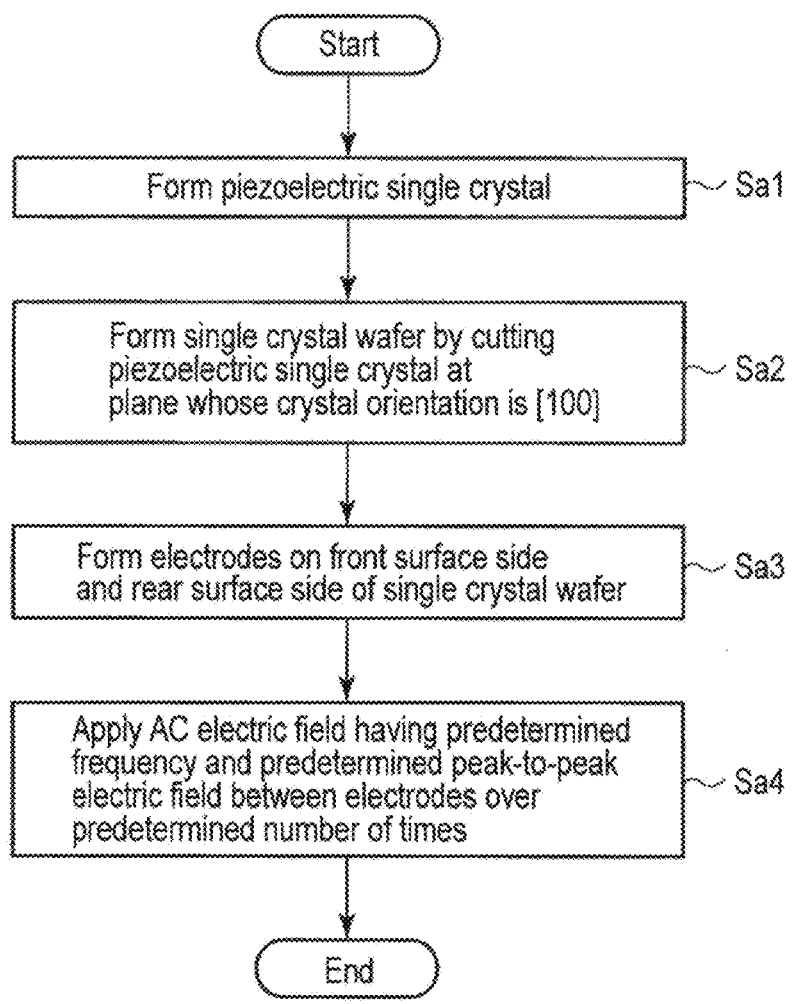
F I G. 1

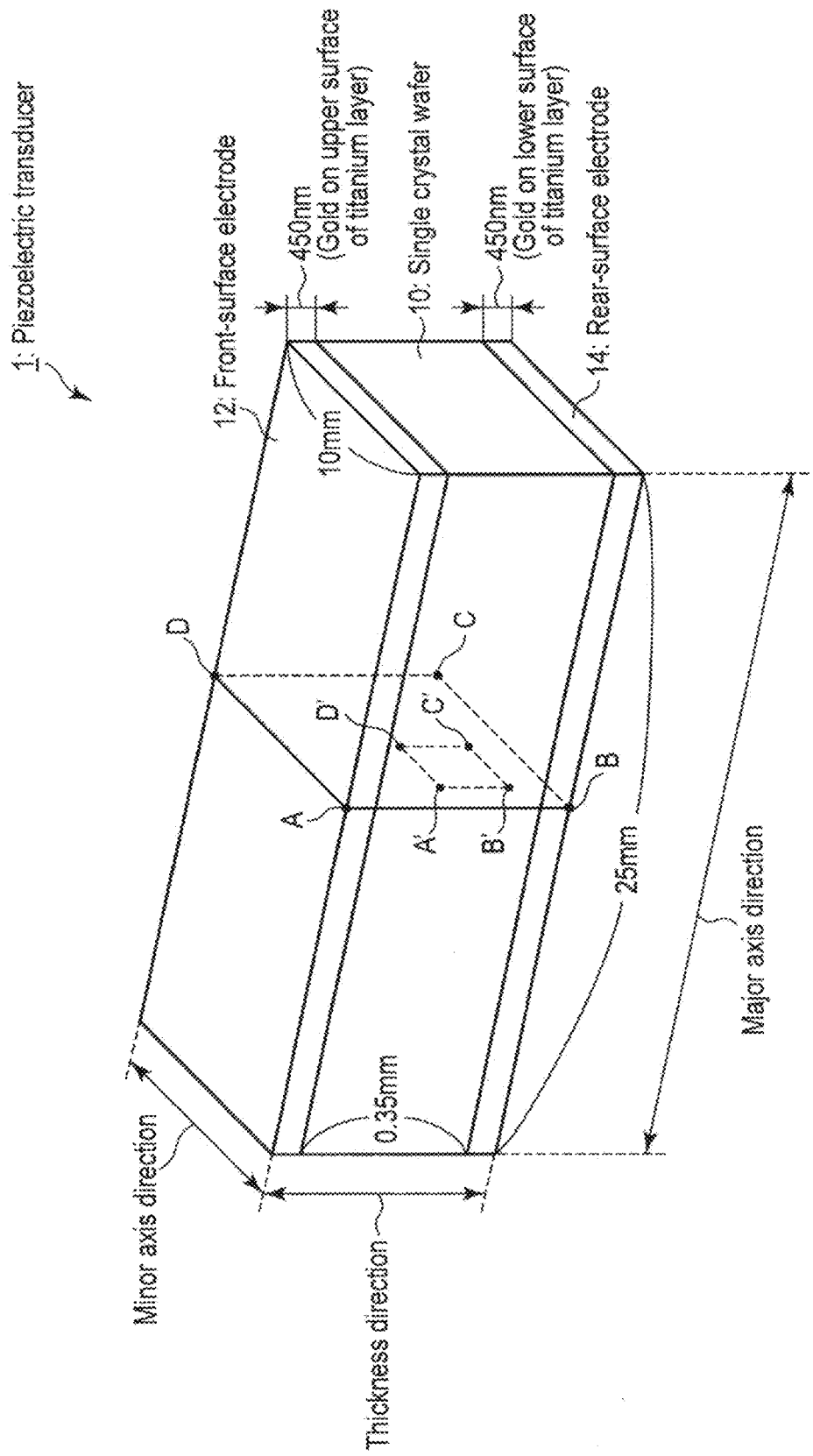
F I G. 2

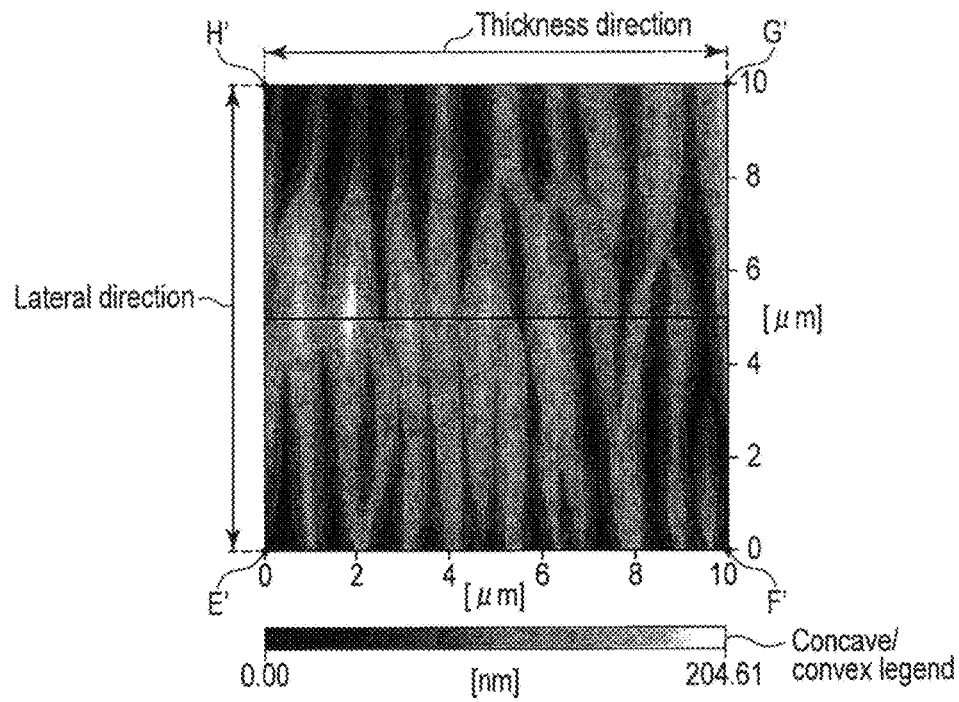
F I G. 8
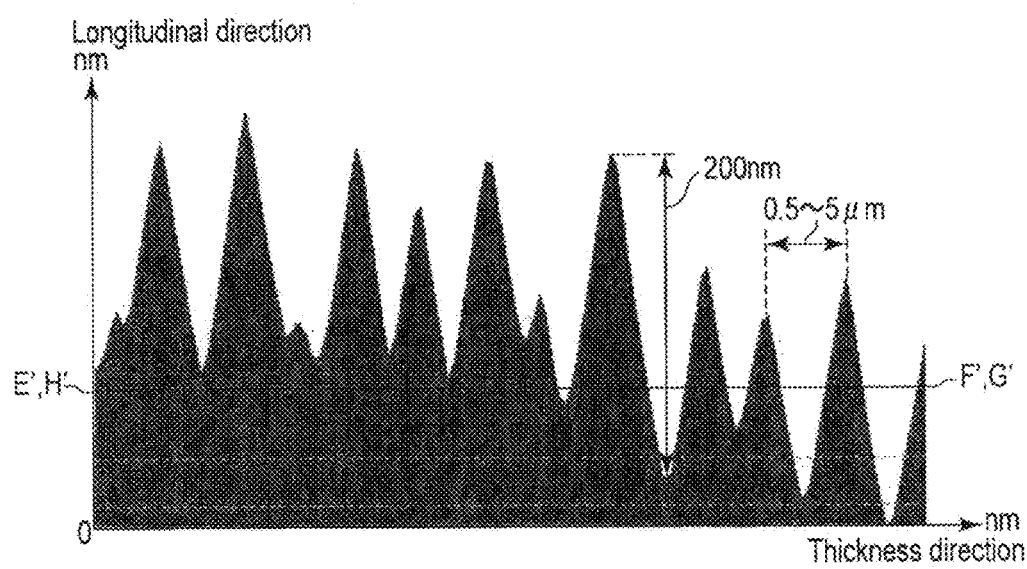
F I G. 9

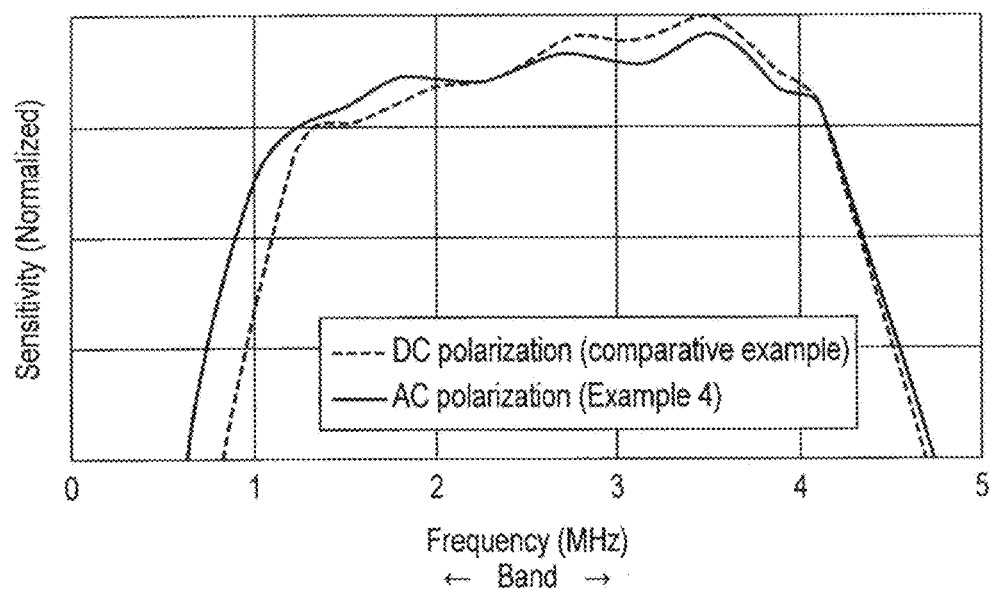
F I G. 12
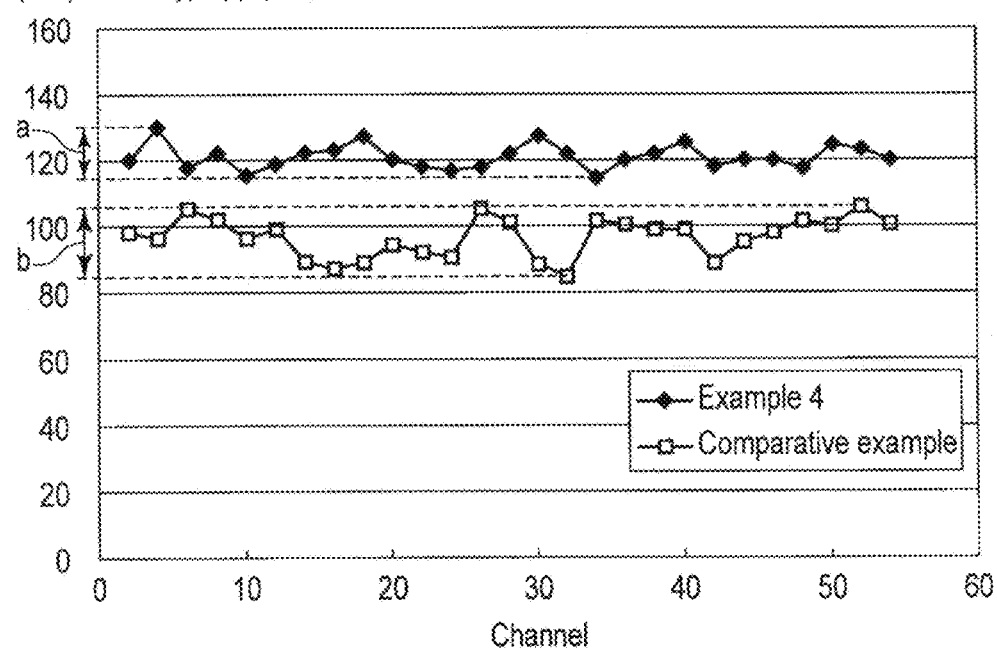
F I G. 13

ULTRASONIC PROBE, PIEZOELECTRIC TRANSDUCER, METHOD OF MANUFACTURING ULTRASONIC PROBE, AND METHOD OF MANUFACTURING PIEZOELECTRIC TRANSDUCER

CROSS-REFERENCE TO RELATED APPLICATIONS

This application is based upon and claims the benefit of priority from Japanese Patent Application No. 2012-187427, filed Aug. 28, 2012, the entire contents of which are incorporated herein by reference.

FIELD

Embodiments described herein relate generally to an ultrasonic probe, a piezoelectric transducer, a method of manufacturing the ultrasonic probe, and a method of manufacturing the piezoelectric transducer.

BACKGROUND

A medical ultrasonic diagnostic apparatus and an ultrasonic image examination apparatus transmit ultrasonic waves to an object via an ultrasonic probe and visualize the inside of the object based on the reflection signal (echo signal) generated by reflected waves from the inside of the object. The medical ultrasonic diagnostic apparatus and the ultrasonic image examination apparatus mainly use an electronic operation type array ultrasonic probe having an ultrasonic transmission/reception function.

A general ultrasonic probe includes a backing member, piezoelectric transducers joined on the backing member and having electrodes formed on the two surfaces of the piezoelectric bodies, and acoustic matching layers joined on the piezoelectric transducers. The piezoelectric transducers and the acoustic matching layers are formed as a plurality of channels by array processing. An acoustic lens is formed on the acoustic matching layers. The electrodes of the piezoelectric transducers corresponding to the respective channels are connected to the apparatus main bodies of the medical ultrasonic diagnostic apparatus and ultrasonic image examination apparatus via a control signal board (flexible printed circuit [FPC] board) and cables.

In such an ultrasonic probe, the piezoelectric transducers are active components which transmit and receive ultrasonic waves. Each piezoelectric transducer is required to have the characteristics of being large in dielectric constant and piezoelectric constant and small in dielectric loss.

As a material for each piezoelectric transducer, PZT (lead zirconate titanate)-based piezoelectric ceramic has been used since 1970s. As a material for each piezoelectric transducer, a high-performance piezoelectric single crystal having a lead complex perovskite structure has begun to be used since about 2005. A high-performance piezoelectric single crystal having a lead complex perovskite structure is formed from a piezoelectric single crystal containing a relaxor-based lead complex perovskite compound comprising lead titanate ($PbTiO_3$) and $Pb(B1, Nb)O_3$ (wherein B1 is at least one of magnesium, zinc, indium, and scandium).

The related art discloses a piezoelectric single crystal which is a pseudo-cubic crystal phase single crystal having a lead complex perovskite structure with the composition $[Pb(Mg, Nb)O_3]_{(1-x)} \cdot [Pb(TiO_3)]_{(x)}$ (to be referred to as PMN-PT hereinafter): (x=0.26 or more to 0.29 or less) or the like, and whose dielectric constant at 25° C. is 5,000 or more and specific dielectric constant at a transformation temperature Trt between a pseudo-cubic crystal phase and a tetragonal crystal phase is 2.5 times or more the specific dielectric constant at 25° C.

Another related art discloses that it is possible to control the domain size of lead zinc niobate-lead titanate $Pb(Zn_{1/3}, Nb_{2/3})O_3$—$Pb(TiO_3)$ (to be referred to as PZN-PT hereinafter) in the range of 8 to 20 μm in accordance with conditions by applying a DC electric field while lowering a high temperature equal to or higher than the phase transition temperature. The domain in this method is formed in a direction parallel to the electrode surface.

BRIEF DESCRIPTION OF THE DRAWING

FIG. 1 is a flowchart showing a procedure for manufacturing a piezoelectric transducer according to an embodiment;

FIG. 2 is a perspective view showing an example of the outer appearance of a piezoelectric transducer according to Example 1 of this embodiment;

FIG. 8 is a view showing a sectional image of a portion E'F'G'H' of the fracture surface obtained by fracturing the piezoelectric transducer in FIG. 7 at a section EFGH;

FIG. 9 is a view showing an example of a concave/convex distribution on a fracture surface E'F'G'H' in FIG. 8 in the thickness direction;

FIG. 12 is a graph showing a frequency spectrum according to Example 4 of this embodiment, together with a frequency spectrum of a comparative example; and FIG. 13 is a graph showing an output (sensitivity) distribution based on a plurality of channels according to Example 4 of this embodiment, together with an output distribution according to a comparative example.

DETAILED DESCRIPTION

Figure 3:
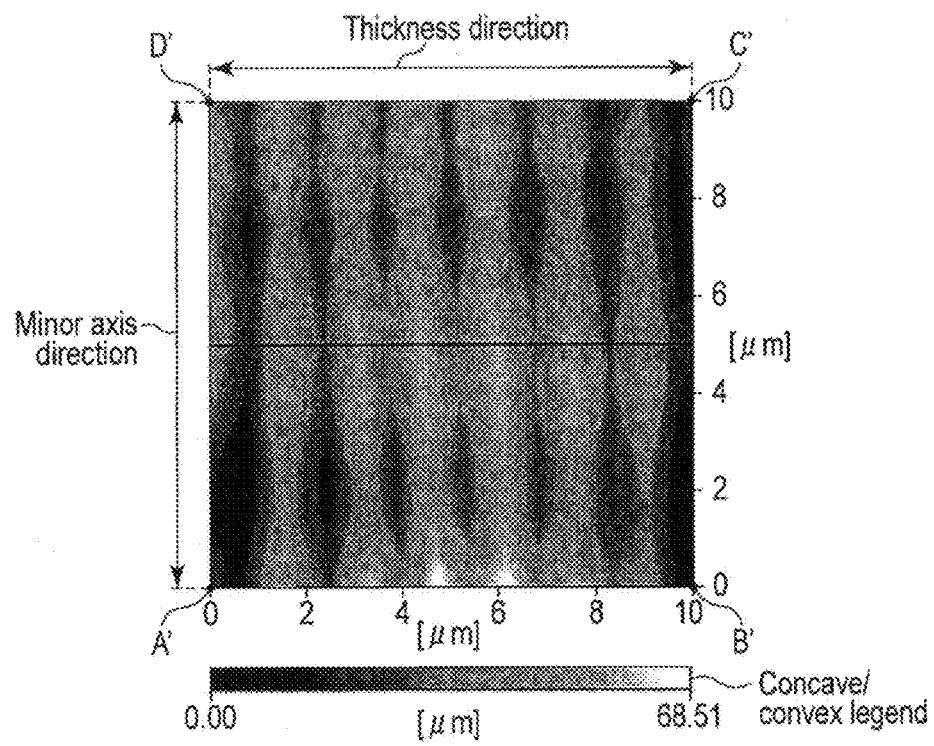
FIG. 3 is a view showing a sectional image of a portion A'B'C'D' of the fracture surface obtained by fracturing the piezoelectric transducer in FIG. 2 at a section ABCD.

In general, according to one embodiment, an ultrasonic probe includes a single crystal piezoelectric body, a first electrode, a second electrode, an acoustic matching layer, a backing member. The single crystal piezoelectric body includes a first plane whose crystal orientation is [100] and a second plane which faces the first plane and whose crystal orientation is [100]. The first electrode is provided on the first plane of the single crystal piezoelectric body. The second electrode is provided on the second plane of the single crystal piezoelectric body. The acoustic matching layer is provided on the first electrode. The backing member is provided under the second electrode. The single crystal piezoelectric body is polarized along a first direction passing through the first electrode, the single crystal piezoelectric body and the second electrode. A fracture surface of the single crystal piezoelectric body that includes the first direction has a multilayer shape along one of the first electrode and the second electrode. A thickness of each layer of the multilayer shape is not less than 0.5 μm and not more than 5 μm.

A method of manufacturing a piezoelectric transducer, a piezoelectric transducer, a method of manufacturing an array ultrasonic probe, and the array ultrasonic probe according to an embodiment will be described below with reference to the accompanying drawings.

A piezoelectric transducer according to this embodiment is manufactured by the following method.

FIG. 1 is a flowchart showing a procedure for manufacturing a piezoelectric transducer according to this embodiment.

A piezoelectric single crystal according to this embodiment contains at least lead titanate ($PbTiO_3$) and a relaxor-based lead complex perovskite compound ($Pb(B1, B2)O_3$) (wherein B1 is at least one of magnesium and indium and B2 is niobium). Methods of manufacturing an ingot of the above piezoelectric single crystal include a flux method, melt Bridgman method, top-seeded solution growth (TSSG) method, horizontal melt Bridgman method, and Czochralski (CZ) method. The embodiment is not limited to the above methods of manufacturing an ingot of the piezoelectric single crystal. A piezoelectric single crystal is manufactured by any one of the above methods (step Sa1).

A lead complex perovskite compound has a phase transition temperature (to be referred to as Trt hereinafter) from a rhombohedral system to a tetragonal crystal phase system, a phase transition temperature (to be referred to as Trm hereinafter) from a rhombohedral system to a monoclinic system, and a phase transition temperature (to be referred to as Tmt hereinafter) from a monoclinic system to a tetragonal crystal phase system in the range of 95° C. or higher to 150° C. or lower. Having a phase transition temperature of less than 95° C. leads to the noticeable temperature dependence of electrical characteristics such as a dielectric constant and a coupling coefficient, as will be described later. Having a phase transition temperature of 150° C. or higher will make it impossible to obtain a desired dielectric constant. For the above reasons, the phase transition temperatures preferably fall within the temperature range of 95° C. or higher to 150° C. or lower.

More specifically, a lead complex perovskite compound contains 67 mol % or more to 74 mol % or less of lead magnesium niobate or lead indium niobate and 26 mol % or more to 33 mol % or less of lead titanate. If the ratio of lead titanate to the lead complex perovskite compound is less than 26 mol %, a high dielectric constant and coupling coefficient cannot be obtained. If the ratio of lead titanate to the lead complex perovskite compound exceeds 33 mol %, the phase transition temperatures Trt, Trm, and Tmt become equal to or lower than 90° C., and the temperature dependence of dielectric constant and coupling coefficient become noticeable especially at temperatures from room temperature to 85° C. For the above reasons, in order to maintain a high dielectric constant and coupling coefficient and to reduce the above temperature dependence at temperatures from room temperature to 85° C., it is necessary to set the ratio of lead titanate to the lead complex perovskite compound to 26 mol % or more to 33 mol % or less.

A lead complex perovskite compound may contain lead indium niobate, lead magnesium niobate, and lead titanate. That is, the lead complex perovskite compound has 0 mol % or more to 50 mol % or less of lead indium niobate, 24 mol % or more to 74 mol % or less of lead magnesium niobate, and 26 mol % or more to 33 mol % or less of lead titanate, totaling to 100 mol %. That is, if $Pb[\{Mg_{1/3}Nb_{2/3}\}x(In_{1/2}Nb_{1/2})y\}Tiz]O_3$, $x=0.24$ to $0.74$, $y=0$ to $0.50$, $z=0.26$ to $0.33$, $x+y=0.67$ to $0.74$, and $x+y+z=1$.

If the ratio of lead titanate to a lead complex perovskite compound is less than 26 mol %, a necessary dielectric constant cannot be obtained. If the ratio of lead titanate to the lead complex perovskite compound exceeds 33 mol %, the temperature dependence of dielectric constant and coupling coefficient becomes noticeable in the temperature range of room temperature to 80° C. That is, the electrical characteristics of the lead complex perovskite compound become unstable in the temperature range of room temperature to 80° C.

If the ratio of lead magnesium niobate to a lead complex perovskite compound is less than 24 mol %, a necessary dielectric constant cannot be obtained. If the ratio of lead magnesium niobate to the lead complex perovskite compound exceeds 74 mol %, the temperature dependence of dielectric constant and coupling coefficient becomes noticeable in the temperature range of room temperature to 80° C. That is, the electrical characteristics of the lead complex perovskite compound become unstable in the temperature range of room temperature to 80° C. If the ratio of lead indium niobate to the lead complex perovskite compound exceeds 50 mol %, it is difficult to form a single crystal of a lead complex perovskite compound. It is sometimes impossible to obtain a single crystal of a lead complex perovskite compound constituted by three components (lead indium niobate, lead magnesium niobate, and lead titanate) with high uniformity.

For the above reasons, in order to maintain a high dielectric constant and coupling coefficient and to reduce the above temperature dependence at temperatures from room temperature to 85° C., the lead complex perovskite compound contains 0 mol % or more to 50 mol % or less of lead indium niobate, 24 mol % or more to 74 mol % or less of lead magnesium niobate, and 26 mol % or more to 33 mol % or less of lead titanate, with the sum of the lead indium niobate and lead magnesium niobate being set to 67 mol % or more to 74 mol % or less, thus totaling to 100 mol %.

A piezoelectric single crystal may contain 15 mol % or less of lead zirconate. At this time, the piezoelectric single crystal has the following composition. That is, the piezoelectric single crystal contains 0 mol % or more to 15 mol % or less of lead zirconate, 0 mol % or more to 50 mol % or less of lead indium niobate, 2 mol % or more to 74 mol % or less of lead magnesium niobate, and 26 mol % or more to 33 mol % or less of lead titanate, totaling to 100 mol %. That is, if the piezoelectric single crystal contains v mol % of lead zirconate, x mol % of lead indium niobate, y mol % of lead magnesium niobate, and z mol % of lead titanate, $v=0$ to $0.15$, $x=0.24$ to $0.74$, $y=0$ to $0.50$, and $z=0.26$ to $0.33$, $v+x+y=0.67$ to $0.74$, and $v+x+y+z=1$.

With regard to crystal orientation, a piezoelectric single crystal whose planes are all {100} is mainly used for ultrasonic probes. A slight amount of manganese oxide or the like may be added to these piezoelectric single crystals.

To set the driving center frequency of the ultrasonic probe to 2 MHz or more to 10 MHz or less, each piezoelectric transducer of the ultrasonic probe used for a medical ultrasonic diagnostic apparatus and ultrasonic image examination apparatus has a thickness of 0.05 mm or more to 0.5 mm or less.

The single crystal ingot obtained by the above method is sliced, starting from a portion near the middle, into a plurality of wafers (thin plates) each having a predetermined thickness by a diamond blade or wire saw. Each wafer is then lapped or polished into a crystal plate (single crystal wafer) having a thickness of 0.05 mm or more to 0.5 mm or less, with the plane on which an electrode is to be formed having crystal orientation [100] (step Sa2).

Subsequently, as electrodes, baked silver or gold, or gold, platinum, nickel, or the like formed by a sputtering method or plating method is formed on the front and rear surfaces of the single crystal wafer to a thickness of about 100 nm or more to 5000 nm or less (step Sa3). The electrode provided on the front surface of the single crystal wafer will be referred to as the front-surface electrode, and the electrode provided on the rear surface of the single crystal wafer will be referred to as the rear-surface electrode. When forming electrodes by the sputtering method, deposition method, or plating method, in order to improve the adhesion property with respect to a single crystal substrate (single crystal wafer), it is preferable to form, as an underlying electrode, for example, a chromium (Cr), nickel (Ni), titanium (Ti), or palladium (Pd) electrode to a thickness of 10 nm or more to 200 nm or less. A single crystal wafer provided with electrodes will be referred to as a piezoelectric transducer hereinafter.

The following polarization process (step Sa4) is executed for this unpolarized piezoelectric transducer.

A polarization electric field in the polarization process (step Sa4) is an AC electric field with a sine or triangular waveform, which has a frequency of 0.1 Hz or more to 1,000 Hz or less without any offset (the absolute value of the maximum voltage is equal to the absolute value of the minimum voltage). A frequency less than 0.1 Hz is a frequency with which it is not possible to obtain the shape and effect (to be described above) unique to the embodiment. A frequency exceeding 1,000 Hz generates heat in a single crystal wafer. This makes the single crystal wafer breakable. For the above reasons, the frequency of an AC electric field needs to fall within the range of 0.1 Hz or more to 1,000 Hz or less. A peak-to-peak (to be referred to as pp hereinafter) electric field in this AC electric field is 0.5 kV/mm or more to 2.5 kV/mm or less. If a pp electric field is less than 0.5 kV/mm, it is difficult to obtain the shape and effect (to be described later) unique to the embodiment. In addition, if a pp electric field exceeds 2.5 kV/mm, heat is generated in the single crystal wafer. This makes the single crystal wafer breakable. For the above reasons, a pp electric field in an AC electric field preferably falls within the range of 0.5 kV/mm or more to 2.5 kV/mm or less. Assume that the process in which an AC electric field starts at 0 kV/mm and ends at 0 kV/mm through one wavelength is defied as one cycle. The polarization process (step Sa4) is the process of applying the above polarization signal to the single crystal wafer in the thickness direction through the formed electrode over two cycles or more to 1,000 cycles or less. If the number of cycles is less than two, it is difficult to obtain the shape and effect (to be described later) unique to the embodiments. If the number of cycles exceeds 1,000, heat is generated in the single crystal wafer. This makes the single crystal wafer breakable. For the above reasons, the number of cycles of applying an AC electric field preferably falls within the range of two cycles or more to 1,000 cycles or less. Note that the number of times (cycles) of application of an AC electric field may be decided in accordance with a single crystal material. Note that the polarization process (step Sa4) is preferably executed in a predetermined temperature environment at a temperature (for example, room temperature) less than the phase transition temperatures Trt, Trm, and Tmt.

Note that a piezoelectric constant d33 was measured at 25° C. by using Berlincourt type Piezo.d33 Meter, ZJ-3D, Institute of Acoustics Academia Sinica. A dielectric constant and dielectric loss were measured at 1 kHz, 1 vrms, and 25° C. by using HP 4284A Precision LCR meter.

Example 1

A 50-nm-thick titanium electrode was formed as a piezoelectric transducer on a [100] plate of a $0.71Pb(Mg_{1/3}, Nb_{2/3})O_3$-$0.29PbTiO_3$(PMN-PT 71/29) single crystal of lead magnesium niobate-lead titanate ($Pb(Mg_{1/3}, Nb_{2/3})O_3$—$PbTiO_3$ by using a sputtering apparatus. A 400-nm-thick gold electrode was formed on the upper portion of the titanium electrode. The dielectric constant and piezoelectric constant of each sample (piezoelectric transducer) which has a size of 10 mm (minor axis)×25 mm (major axis)×0.35 mm (thickness) and on which the electrode was formed were evaluated at a room temperature of 25° C. A coercive electric field Ec at room temperature was evaluated by a Sawyer-Tower circuit, and was 0.3 kV/mm. This sample was unpolarized by annealing. A polarization process (to be referred to as AC polarization hereinafter) was executed for this unpolarized sample by applying a sine wave having a frequency of 1 Hz and a pp electric field of 1 kV/mm to the sample in 20 cycles. A room temperature dielectric constant ∈r and piezoelectric constant of the sample were measured 24 hours after the polarization process. The measured room temperature dielectric constant ∈r, dielectric loss, and piezoelectric constant were 9,000, 0.3%, and 2,100 pC/N, respectively. Note that a room temperature dielectric constant and a piezoelectric constant are average values obtained from five samples. At this time, each layer of the multilayer shape of a fracture surface of the piezoelectric single crystal body had a thickness of 1.5 μm.

An ultrasonic probe according to this embodiment containing a single crystal piezoelectric body which is formed from a lead complex perovskite compound containing at least one of magnesium oxide and indium oxide and niobium oxide and has a first plane whose crystal orientation is [100] and a second plane which faces the first plane and whose crystal orientation is [100], a first electrode provided on the first plane of the single crystal piezoelectric body, a second electrode provided on the second plane of the single crystal piezoelectric body, an acoustic matching layer provided on the first electrode, and a backing member provided under the second electrode. The single crystal piezoelectric body is polarized along the first direction passing through the first electrode, the single crystal piezoelectric body, and the second electrode, with a fracture surface including the first direction having a multilayer shape along the second direction perpendicular to the first direction, and each layer of the multilayer shape having a thickness of 0.5 μm or more to 5 μm or less.

FIG. 2 is a perspective view showing an example of the outer appearance of a piezoelectric transducer 1 of this embodiment. Referring to FIG. 2, a front-surface electrode (first electrode) 12 is provided on the front surface (first plane) as a crystal orientation [100] plane of a single crystal wafer (single crystal piezoelectric body) 10. Referring to FIG. 2, a rear-surface electrode (second electrode) 14 is provided on the rear surface (second plane) as a crystal orientation [100] plane of the single crystal wafer 10. Assume that the thickness direction (first direction) is one direction passing through the front-surface electrode 12, the single crystal wafer 10, and the rear-surface electrode 14. Referring to FIG. 2, the thickness direction is a direction perpendicular to the front-surface electrode 12 and the rear-surface electrode 14. That is, the thickness direction is perpendicular to a crystal orientation [100] plane of the single crystal wafer 10. In addition, assume that one direction parallel to a crystal orientation [100] plane of the single crystal wafer 10 and perpendicular to the thickness direction is a minor axis direction (second direction). The single crystal wafer 10 is polarized along the thickness direction.

FIG. 3 is a view showing a sectional image of a portion A'B'C'D' of the fracture surface obtained by fracturing the piezoelectric transducer 1 in FIG. 2 at a section ABCD. A side AB is parallel to a side A'B'. A side CD is parallel to a side C'D'. Points A, B, C, and D respectively correspond to points A', B', C', and D'. Assume that a thickness direction (first direction) is one direction passing through the front-surface electrode 12, the single crystal wafer 10, and the rear-surface electrode 14. Referring to FIG. 3, the thickness direction is a direction perpendicular to the front-surface electrode 12 and the rear-surface electrode 14. That is, the thickness direction is perpendicular to a crystal orientation [100] plane of the single crystal wafer 10. In addition, assume that one direction parallel to a crystal orientation [100] plane of the single crystal wafer 10 and perpendicular to the thickness direction is a minor axis direction. The single crystal wafer 10 is polarized along the thickness direction. More specifically, FIG. 3 is a view showing a sectional image of the portion (10 μm×10 μm) A'B'C'D' of the fracture surface ABCD, with a concave/convex legend, in the piezoelectric transducer 1 formed from $0.71Pb(Mg_{1/3}, Nb_{2/3})O_3$-$0.29PbTiO_3$(PMN-PT 71/29) of lead magnesium niobate-lead titanate $(Pb(Mg_{1/3}, Nb_{2/3})O_3$—$PbTiO_3)$. As shown in FIG. 3, a sectional image of the fracture surface A'B'C'D' exhibits a multilayer shape parallel to the minor axis direction.

In this case, "along the thickness direction" additionally indicates that even if all the layers on a fracture surface are not parallel to the minor axis direction, an approximate line of one of the layers is almost parallel to the thickness direction.

Figure 4:
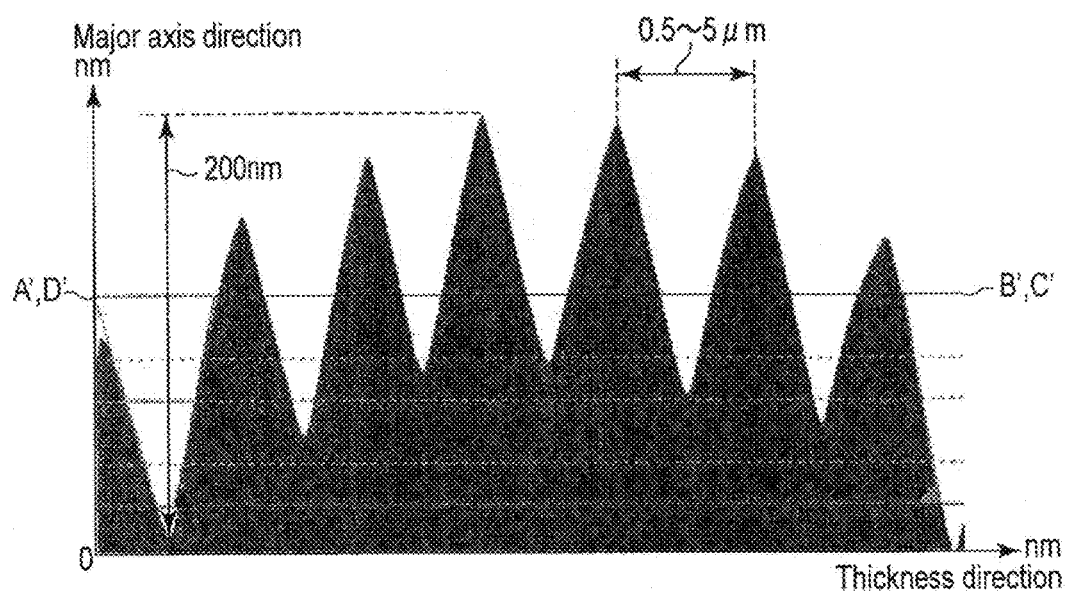
FIG. 4 is a view showing an example of a concave/convex distribution on a fracture surface A'B'C'D' in FIG. 3 in the thickness direction.

FIG. 4 is a view showing an example of a concave/convex distribution on the fracture surface A'B'C'D' in FIG. 2 in the major axis direction corresponding to the thickness direction. As shown in FIG. 4, the fracture surface A'B'C'D' has a regular concave/convex shape corresponding to the above multilayer shape. The length defined by concave and convex portions of the fracture surface is, for example, 200 nm. The interval between adjacent concave portions or between convex portions is, for example, 0.5 μm or more to 5 μm or less.

The interval between adjacent concave portions or between convex portions formed by the execution of AC polarization, i.e., the range of the thickness of the respective layers of a multilayer shape (0.5 μm or more to 5 μm or less), will be described. A lower thickness limit (0.5 μm) corresponds to the lower thickness limit of the layers formed by AC polarization. The upper limit (5 μm) of a thickness range is the upper thickness limit, of the thicknesses of the layers formed by AC polarization, which allows to obtain a desired high dielectric constant and high piezoelectric constant.

The thickness range of the respective layers of a multilayer shape is especially preferably 0.5 μm or more to 2 μm or less. This is because, if the thickness of each layer is 2 μm or less, the dielectric constant and coupling coefficient, in particular, increase, thereby contributing to improvement in sensitivity.

It is thought that each concave portion of the multilayer shape in FIG. 3 corresponds to a polarized domain (domain structure) having a downward polarization direction perpendicular to the drawing surface, and each convex portion of the multilayer shape in FIG. 3 corresponds to a polarized domain (domain structure) having an upward polarization direction perpendicular to the drawing surface.

Comparative Example

For comparison, a piezoelectric transducer having the same arrangement as that in Example 1 in an unpolarized state was polarized under general DC polarization conditions, i.e., a DC electric field of 0.5 kV/mm and a polarization time of 30 minutes. The room temperature dielectric constant ∈r and piezoelectric constant of each piezoelectric transducer were measured 24 hours after the polarization process. The dielectric constant ∈r, dielectric loss, and piezoelectric constant, as average values of five samples, were 5,600, 0.4%, and 1,450 pC/N, respectively.

Figure 5:
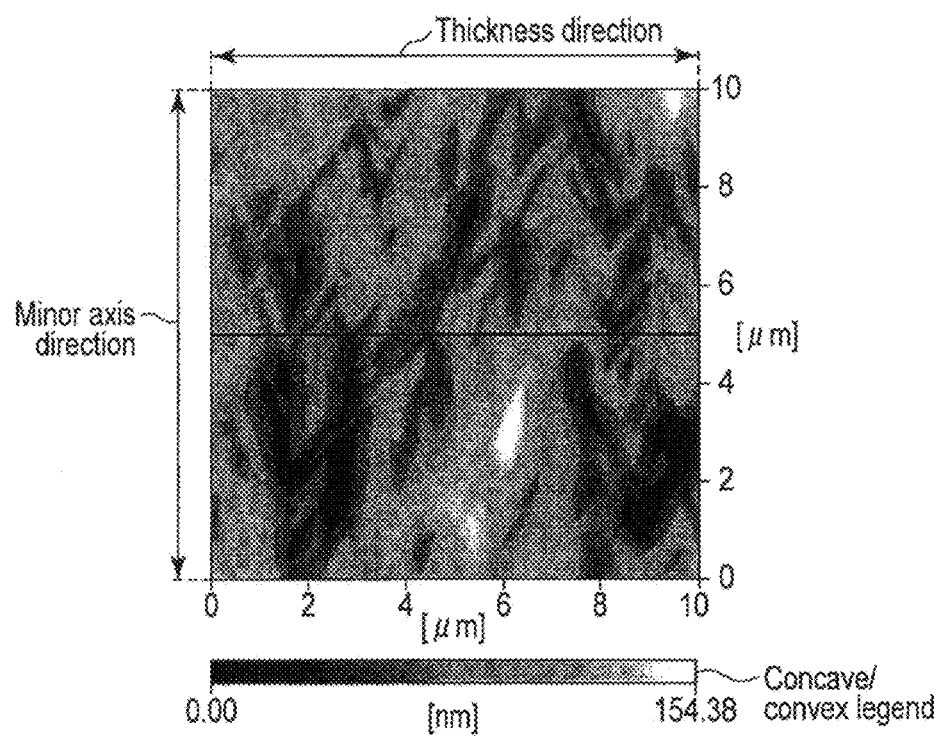
FIG. 5 is a view showing a sectional image of a portion, of a piezoelectric transducer (comparative example) formed from DC-polarized PMN-PT (71/29), which corresponds to the portion (10 μm×10 μm) A'B'C'D' of the fracture surface ABCD, together with a concave/convex legend.

FIG. 5 is a view showing a sectional image of a portion, of the piezoelectric transducer (comparative example) formed from DC-polarized PMN-PT (71/29), which corresponds to the portion (10 μm×10 μm) A'B'C'D' of the fracture surface ABCD, together with a concave/convex legend. As shown in FIG. 5, the fracture surface has a wedge shape and does not have a regular shape (multilayer shape) along the thickness direction.

Figure 6:
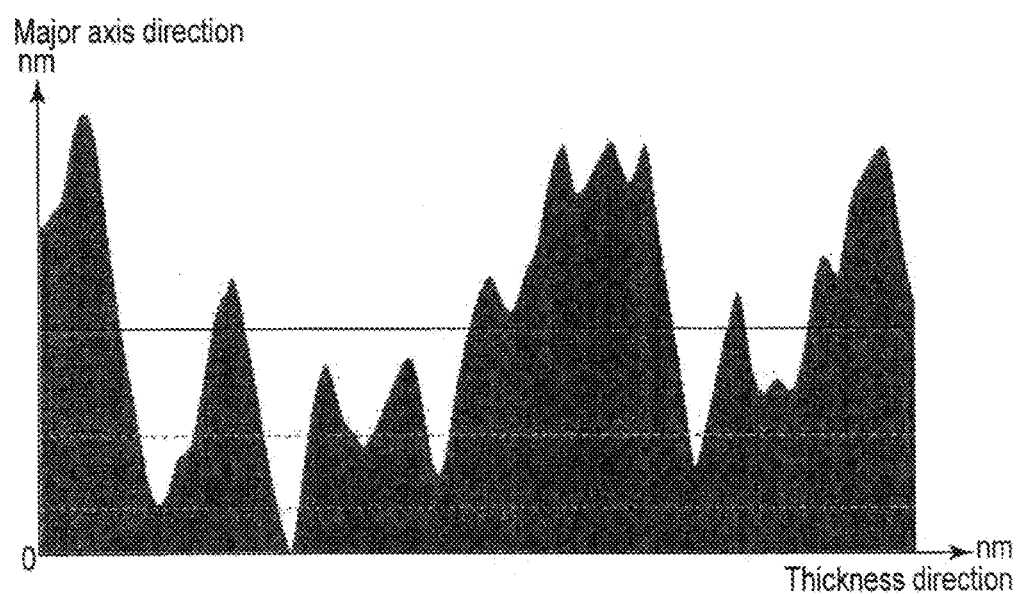
FIG. 6 is a view showing an example of a concave/convex distribution in the thickness direction on a fracture surface according to a comparative example which corresponds to the portion A'B'C'D' of the fracture surface ABCD in FIG. 3.

FIG. 6 is a view showing an example of a concave/convex distribution in the major axis direction corresponding to the thickness direction on the fracture surface according to the comparative example which corresponds to the portion A'B'C'D' of the fracture surface ABCD in FIG. 3. As shown in FIG. 6, the fracture surface according to the comparative example does not have a regular concave/convex shape.

Example 2

The unpolarized piezoelectric transducer disclosed in Example 1 was divided into two portions along the major axis direction. AC polarization was executed for one portion, and DC polarization was executed for the other portion. As described above, this indicated that AC polarization obtained a high dielectric constant and piezoelectric constant and a low dielectric loss.

Example 3

A single crystal wafer having an outer size of 12 mm×12 mm and a thickness of 0.3 mm was manufactured by polishing a $0.24Pb(In_{1/2}, Nb_{1/2})O_3$-$0.45Pb(Mg_{1/3}, Nb_{2/3})O_3$-$0.31PbTiO_3$(PIN-PMN-PT 24/45/31) [100] plate of lead indium niobate-lead magnesium niobate-lead titanate $(Pb(In_{1/2}, Nb_{1/2})O_3$—$Pb(Mg_{1/3}, Nb_{2/3})O_3$—$PbTiO_3$. The crystal orientation of a 12 mm×12 mm surface of the single crystal wafer is [100] (to be referred to as a [100] plane hereinafter). A 300-nm-thick nickel (Ni) layer is formed on the [100] plane by applying palladium (Pd) strike using a wet electroless plating method, and a 200-nm-thick gold (Au) layer is formed on the nickel layer, thereby forming an electrode. The single crystal wafer (piezoelectric transducer) provided with the electrode is cut into a wafer having an outer size of 5 mm×5 mm. The piezoelectric transducer having undergone the cutting process has a phase transition temperature Trt of about 100° C. and a Curie temperature of about 190° C. A coercive electric field Ec of the piezoelectric transducer having undergone the cutting process was measured by a Sawyer-Tower circuit. The coercive electric field Ec was 0.6 kV/mm.

In a polarization process, an AC electric field was applied to the piezoelectric transducer having undergone the cutting process over 500 times by using sine waves with a pp electric field of 0.8 kV/mm or more to 2.5 kV/mm or less at a frequency of 50 Hz. After the polarization process, DC polarization was executed between the electrodes, which were used for AC polarization, by applying a DC electric field of 1.2 kV/mm between the electrodes at room temperature for 5 minutes. A dielectric constant and piezoelectric constant of each sample were measured 24 hours after DC polarization. The measured room temperature dielectric constant ∈r, dielectric loss, and piezoelectric constant were 9,500, 0.4%, and 3,500 pC/N, respectively. Note that the room temperature dielectric constant, piezoelectric constant, and dielectric loss are average values obtained from five samples. At this time, each layer of the multilayer shape of a fracture surface of the piezoelectric single crystal body had a thickness of 0.8 μm.

The main purpose of DC polarization after AC polarization and a cutting process is to recover (align) variations in polarization due to the heat generated in the single crystal wafer by the cutting process. For this reason, for example, the electric field used for DC polarization can be an electric field which is lower than a pp electric field in AC polarization and can recover variations in polarization. More specifically, an electric field used for DC polarization is 0.25 kV/mm or more to 2.5 kV/mm or less. The application of a DC electric field after the above AC polarization can also be applied to Examples 1 to 3. Note that if DC polarization has been executed before AC polarization (for example, at the time of shipment of a piezoelectric transducer), it is preferable to unpolarize a single crystal wafer in advance before the execution of AC polarization. In addition, the time period of execution of DC polarization depends on the amount of heat generated in a single crystal wafer by cutting or dicing. For example, this time period is generally 1 sec or more to 30 minutes or less at room temperature (20° C. or higher to 25° C. or lower).

Figure 7:
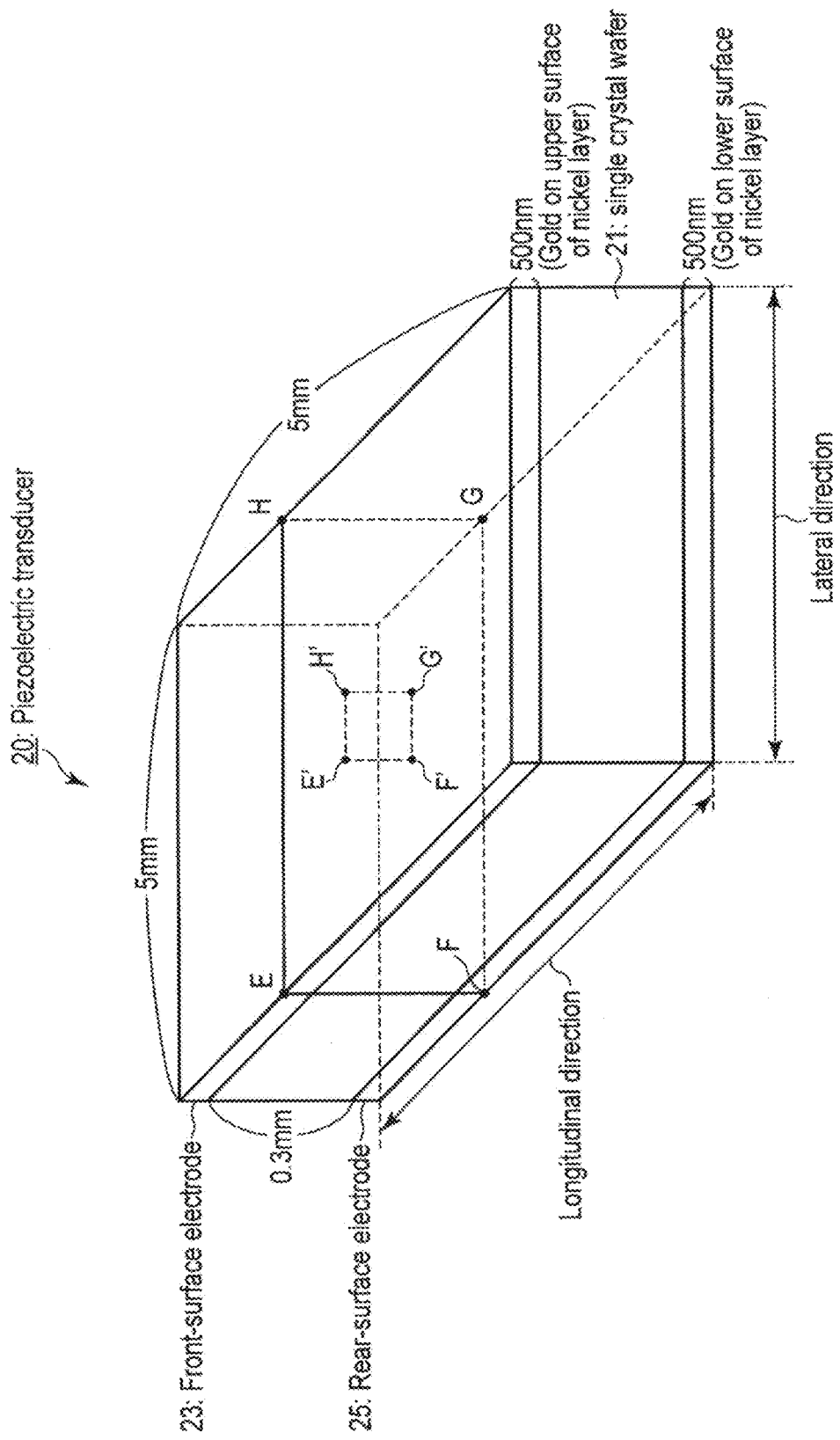
FIG. 7 is a perspective view showing an example of a piezoelectric transducer according to Example 3 of this embodiment.

FIG. 7 is a perspective view showing an example of the outer appearance of a piezoelectric transducer 20 according to this embodiment. Referring to FIG. 7, a front-surface electrode 23 is provided on the front surface, as a crystal orientation [100] plane, of a single crystal wafer 21. Referring to FIG. 7, a rear-surface electrode 25 is provided on the rear surface, as a crystal orientation [100] plane, of the single crystal wafer 21.

FIG. 8 is a view showing a sectional image of a portion E'F'G'H' of the fracture surface obtained by fracturing the piezoelectric transducer 20 in FIG. 7 at a section EFGH. More specifically, FIG. 8 is a view showing a sectional image of the portion (10 μm×10 μm) E'F'G'H' of the fracture surface EFGH of the piezoelectric transducer 20 formed from 0.24Pb(In$_{1/2}$, Nb$_{1/2}$)O$_3$-0.45Pb(Mg$_{1/3}$, Nb$_{2/3}$)O$_3$-0.31PbTiO$_3$(PIN-PMN-PT 24/45/31) of lead indium niobate-lead magnesium niobate-lead titanate (Pb(In$_{1/2}$, Nb$_{1/2}$)O$_3$—Pb(Mg$_{1/3}$, Nb$_{2/3}$)O$_3$—PbTiO$_3$) according to Example 3, together with a concave/convex legend. As shown in FIG. 8, the fracture surface E'F'G'H' has a multilayer shape parallel to the lateral direction along the thickness direction. At this time, each layer of the multilayer shape of the fracture surface of the piezoelectric single crystal body had a thickness of 0.8 μm.

FIG. 9 is a view showing an example of a concave/convex distribution on the fracture surface E'F'G'H' in FIG. 7 in the longitudinal direction corresponding to the thickness direction. A side EF is parallel to a side E'F'. A side GH is parallel to a side G'H'. Points E, F, G, and H respectively correspond to points E', F', G', and H'. Assume that a thickness direction (first direction) is one direction passing through the front-surface electrode 12, the single crystal wafer 10, and the rear-surface electrode 14. Referring to FIG. 9, the thickness direction is a direction perpendicular to the front-surface electrode 12 and the rear-surface electrode 14. That is, the thickness direction is perpendicular to a crystal orientation [100] plane of the single crystal wafer 10. In addition, assume that one direction parallel to a crystal orientation [100] plane of the single crystal wafer 10 and perpendicular to the thickness direction is a minor axis direction. The single crystal wafer 10 is polarized along the thickness direction.

As shown in FIG. 9, the fracture surface E'F'G'H' has an almost regular concave/convex shape corresponding to the above multilayer shape. The length defined by concave and convex portions of the fracture surface is, for example, 200 nm. The interval between adjacent concave portions or between convex portions is, for example, 0.5 μm or more to 5 μm or less.

It is thought that each concave portion of the multilayer shape in FIG. 8 corresponds to a polarized domain (domain structure) having a downward polarization direction perpendicular to the drawing surface, and each convex portion of the multilayer shape in FIG. 8 corresponds to a polarized domain (domain structure) having an upward polarization direction perpendicular to the drawing surface.

The dielectric constant and piezoelectric constant in Example 3 exhibited high values 1.2 times or more to 2 times or less those in the following comparative example.

Comparative Example

For comparison, an unpolarized piezoelectric transducer having the same arrangement as that in Example 3 was DC-polarized by applying a DC electric field of 1.2 kV/mm to the piezoelectric transducer at room temperature for 5 minutes. The dielectric constant, dielectric loss, and piezoelectric constant of each piezoelectric transducer were measured 24 hours after the DC polarization.

As a result, a room temperature dielectric constant ∈r, dielectric loss, and piezoelectric constant were 5,500, 0.6%, and 1,700 pC/N, respectively. Note that the room temperature dielectric constant, piezoelectric constant, and dielectric loss are the average values obtained from five samples.

Although not shown, a sectional image of a portion, of the piezoelectric transducer (comparative example) formed from PIN-PMN-PT (24/45/31) to which a DC electric field has been applied in a polarization process, which corresponds to the portion (10 μm×10 μm) E'F'G'H' of the fracture surface EFGH has a wedge shape and does not have an almost regular shape (multilayer shape) along the thickness direction. In addition, the fracture surface of the comparative example which corresponds to the fracture surface E'F'G'H' does not have an almost regular concave/convex shape.

Example 4

The arrangement of an ultrasonic probe using the piezoelectric transducer manufactured through the above polarization process will be described below with reference to FIG. 10.

Figure 10:
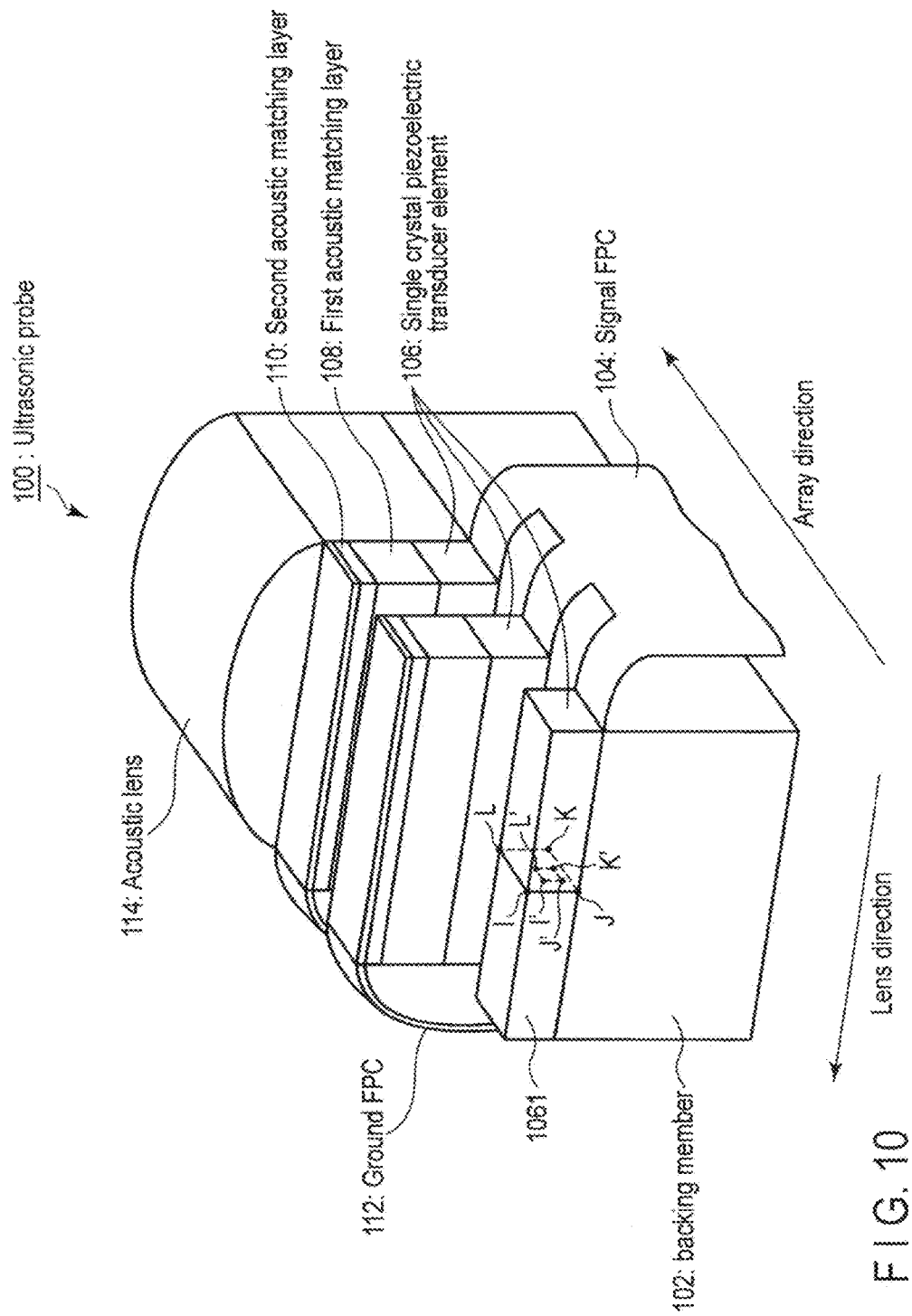
FIG. 10 is a view showing an example of the structure of an ultrasonic probe according to Example 4 of this embodiment.

As shown in FIG. 10, an ultrasonic probe 100 includes a backing member 102, a signal flexible printed circuit (FPC) 104, a single crystal piezoelectric transducer element 106, a first acoustic matching layer 108, a second acoustic matching layer 110, a ground FPC 112, and an acoustic lens 114. For the sake of simplicity, FIG. 10 omits an illustration of the first and second acoustic matching layers and ground FPC on the front surface of a single crystal piezoelectric transducer element 1061.

The backing member 102 is made of rubber. A material having a low acoustic impedance (AI=2 MRayls or more to 6 MRayls or less) or a metal with high hardness is used for the backing member 102. The signal FPC 104 is provided on the front surface side of the backing member 102. Metal wirings are arranged on the front surface side of the signal FPC 104. The single crystal piezoelectric transducer element 106 is manufactured by dicing the above piezoelectric transducer (a single crystal wafer provided with electrodes). The single crystal piezoelectric transducer element 106 includes a single crystal piezoelectric body formed from the lead complex perovskite compound described in Examples 1 to 3 and electrodes (a front-surface electrode and a rear-surface electrode) (not shown) on the ultrasonic wave emission surface side and rear surface side of the single crystal piezoelectric body. Note that an underlying electrode may be provided on the single crystal piezoelectric body side of each electrode. The first acoustic matching layer 108 is provided on the ultrasonic wave emission surface side of the single crystal piezoelectric transducer element 106. The first acoustic matching layer 108 includes electrodes (not shown) on the front surface side and the rear surface side. The second acoustic matching layer 110 is provided on the front surface side of the first acoustic matching layer 108. The second acoustic matching layer 110 includes electrodes (not shown) on the front surface side and the rear surface side. The ground FPC 112 includes a ground electrode on the rear surface side. The acoustic lens 114 is provided on the front surface side of the ground FPC 112.

When a single crystal piezoelectric body is formed from PMN-PT (71/29), a portion I'J'K'L' of a section IJKL of the single crystal piezoelectric transducer element 1061 in FIG. 10 corresponds to the portion A'B'C'D' in FIG. 2. In this case, the shape of a fracture surface at the portion I'J'K'L' corresponds to the shape of the fracture surface in FIGS. 3 and 4. When a single crystal piezoelectric body is formed from PIN-PMN-PT (24/45/31), a section I'J'K'L' of the single crystal piezoelectric transducer element 1061 in FIG. 10 corresponds to the portion E'F'G'H' in FIG. 7. In this case, the shape of a fracture surface at the portion I'J'K'L' corresponds to the shape of the fracture surface in FIGS. 8 and 9.

Note that three or four acoustic matching layers may be arranged on the ultrasonic wave emission surface side of the single crystal piezoelectric transducer element 106 as well as two acoustic matching layers. When a plurality of acoustic matching layers are provided on the ultrasonic wave emission surface side of the single crystal piezoelectric transducer element 106, the acoustic impedances of the respective acoustic matching layers decrease stepwise from the single crystal piezoelectric transducer element 106 to the acoustic lens 114. For example, in the case of one acoustic matching layer, the first acoustic matching layer (first acoustic matching layer) immediately on the single crystal piezoelectric transducer element 106 has an acoustic impedance of 4 MRayls or more to 7 MRayls or less at 25° C. In the case of two acoustic matching layers, the first acoustic matching layer 108 immediately on the single crystal piezoelectric transducer element 106 is preferably formed from a material having an acoustic impedance of 5 MRayls or more to 10 MRayls or less at 25° C., and the second acoustic matching layer (second acoustic matching layer 110) is preferably formed from a material having an acoustic impedance of 2 MRayls or more to 4 MRayls or less at 25° C.

In the case of one acoustic matching layer, the first acoustic matching layer 108 is preferably formed from a material whose acoustic impedance has been adjusted by, for example, adding oxide particles to carbon as a conductive material and epoxy resin as an organic substance.

In the case of two acoustic matching layers, the first acoustic matching layer 108 is preferably formed from, for example, carbon and an oxide-containing epoxy resin material, and the second acoustic matching layer 110 is preferably formed from, for example, epoxy silicone or a polyethylene-based resin material. Note that if an insulating epoxy material is used for an acoustic matching layer, the surface of the acoustic matching layer may be provided with conductivity by plating or the like, as needed.

In the case of three acoustic matching layers, the first acoustic matching layer 108 is preferably formed from, for example, a glass material, the second acoustic matching layer 110 is preferably formed from, for example, a material obtained by filling carbon and epoxy with an oxide, and the third acoustic matching layer is preferably formed from a polyethylene-based resin material or silicone-based resin. If an insulating material is used for an acoustic matching layer, the surface of the acoustic matching layer may be provided with conductivity by sputtering, plating, or the like, as needed.

Figure 11:
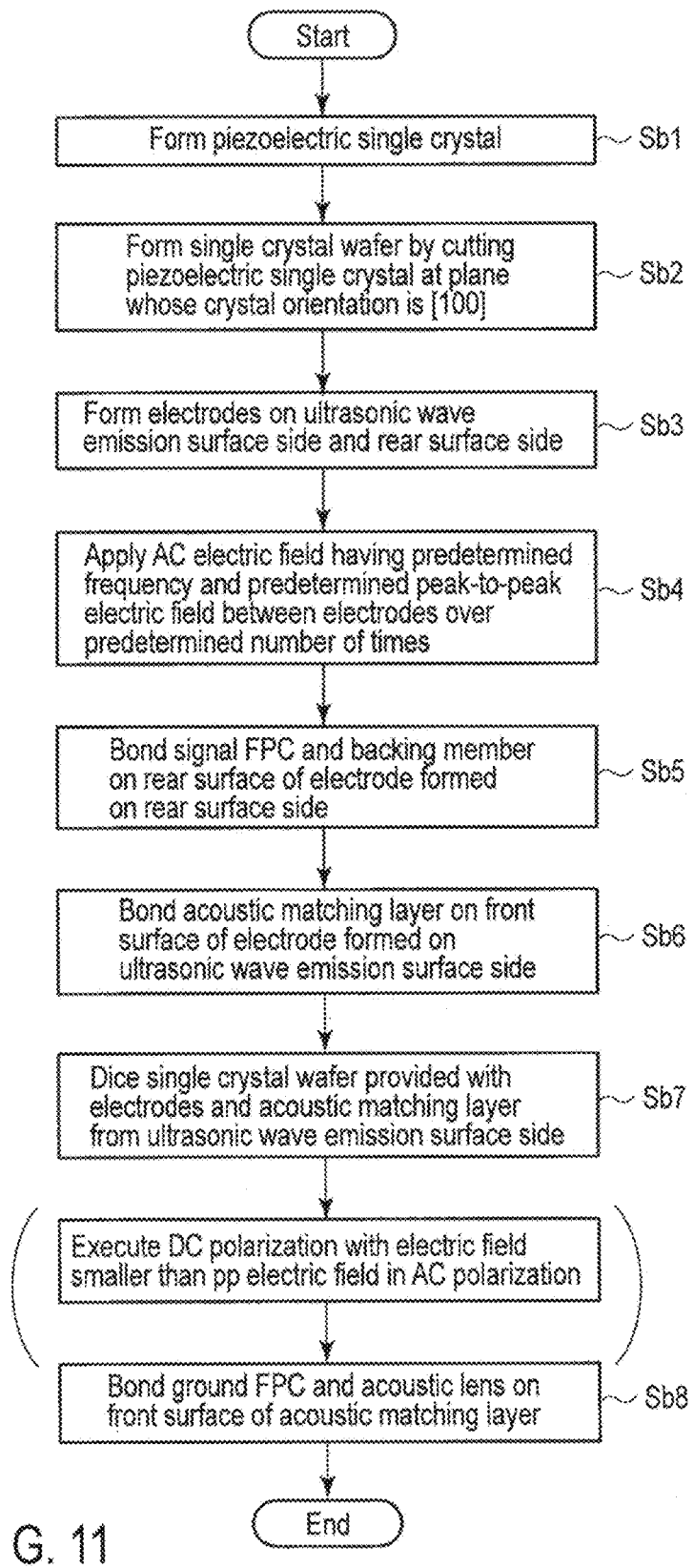
FIG. 11 is a flowchart showing a procedure for manufacturing the ultrasonic probe according to Example 4 of this embodiment.

FIG. 11 is a flowchart showing a procedure for a method of manufacturing the ultrasonic probe 100 described with reference to FIG. 10. First of all, a piezoelectric transducer is manufactured by the method described in association with the above method of manufacturing a piezoelectric transducer (steps Sb1 to Sb4). The signal FPC 104 and the backing member 102 are bonded to the rear surface side of the piezoelectric transducer (step Sb5). A plurality of acoustic matching layers are bonded to the ultrasonic wave emission surface side of the piezoelectric transducer (step Sb6). The piezoelectric transducer is diced by a dicing blade at predetermined intervals from the ultrasonic wave emission surface to the backing member (step Sb7). The piezoelectric transducer and the plurality of acoustic matching layers are divided into a plurality of portions by this dicing process. This forms a plurality of channels respectively corresponding to the plurality of single crystal piezoelectric bodies. DC polarization with an electric field smaller than a pp electric field in AC polarization may be executed after dicing. Some of the gaps formed by the dividing process may be filled with an insulating resin. After the filled resin is hardened, an acoustic lens is boded on the divided acoustic matching layers (step Sb8).

The transmission of ultrasonic waves using the ultrasonic probe 100 manufactured by the above manufacturing method will be described. The ultrasonic probe 100 is brought into contact with the object. A predetermined voltage is applied between the electrode on the ultrasonic wave emission surface of the single crystal piezoelectric transducer element 106 and the electrode on the rear surface of the single crystal piezoelectric transducer element 106.

The application of the predetermined voltage makes the single crystal piezoelectric transducer element 106 resonate to generate ultrasonic waves. The generated ultrasonic waves are transmitted to the object via the first acoustic matching layer 108, second acoustic matching layer 110, and acoustic lens 114.

The reception of ultrasonic waves using the ultrasonic probe 100 manufactured by the above manufacturing method will be described. The ultrasonic waves generated in the object make the single crystal piezoelectric transducer element 106 vibrate via the acoustic lens 114, first acoustic matching layer 108, and second acoustic matching layer 110. The single crystal piezoelectric transducer element 106 converts the vibrations generated by ultrasonic waves into electrical signals. The electrical signals are delayed and added for the respective channels in accordance with depths in the object. The delayed/added signal is envelope-detected and logarithmically converted to be displayed as an image. It is possible to improve the transmission/reception efficiency of ultrasonic waves by setting the acoustic impedance between the first acoustic matching layer 108 and the second acoustic matching layer 110 so as to make it gradually approach the acoustic impedance of the object between the acoustic impedance of the single crystal piezoelectric transducer element 106 (20 to 30 MRayls) and the acoustic impedance (1.5 MRayls) of the object.

Note that the number of acoustic matching layers forming channels is not limited to two, and may be three or four. In this case, acoustic matching layers may be formed on the ground FPC 112.

FIG. 12 is a graph showing sensitivities corresponding to frequencies (to be referred to as a frequency spectrum hereinafter) in association with the ultrasonic probe 100 (Example 4) having a single crystal piezoelectric body for which polarization processing using an AC electric field (to be referred to as AC polarization hereinafter) has been executed, together with a frequency spectrum according to the comparative example (the ultrasonic probe having the single crystal piezoelectric body to which a polarization process using a DC electric field [DC polarization] has been executed). As shown in FIG. 12, the frequency spectrum concerning the ultrasonic probe 100 according to Example 4 is wider in band and higher in sensitivity than a frequency spectrum concerning the ultrasonic probe according to the comparative example.

FIG. 13 is a graph showing an output (sensitivity) distribution based on a plurality of channels in association with the ultrasonic probe 100 (Example 4) including a single crystal piezoelectric body having undergone AC polarization, together with an output distribution according to a comparative example (an ultrasonic probe including a single crystal piezoelectric body having undergone DC polarization). As shown in FIG. 13, variations (a in FIG. 13) in output based on a plurality of channels in the ultrasonic probe 100 according to Example 4 are smaller than variations (b in FIG. 13) in output based on a plurality of channels in an ultrasonic probe according to a comparative example. In addition, outputs from the channels of the ultrasonic probe 100 according to Example 4 are larger than those from the channels of an ultrasonic probe according to a comparative example. That is, the sensitivity of the ultrasonic probe 100 of Example 4 was 1.2 times, in average, that of the comparative example. That is, the sensitivity of the ultrasonic probe according to Example 4 improved by 20% as compared with the related art.

The following effects can be obtained by the arrangements and methods described above.

Manufacturing a piezoelectric single crystal element requires accurate adjustment of material compositions. If it is not necessary to adjust any compositions, manufacturing a piezoelectric single crystal element requires accurate temperature control and takes long time for polarization. In addition, piezoelectric transducers are required to have uniform dielectric and piezoelectric characteristics inside each piezoelectric transducer and among the plurality of piezoelectric transducers.

The method of manufacturing a piezoelectric transducer according to this embodiment can manufacture a piezoelectric transducer having a high dielectric constant and a high piezoelectric constant at a low cost in a short period of time by postprocessing (AC polarization) after the manufacture of a single crystal. A fracture surface of the piezoelectric transducer manufactured by the method of manufacturing a piezoelectric transducer according to this embodiment or of the piezoelectric transducer according to the embodiment has a multilayer shape having a predetermined thickness. It is thought that the multilayer shape corresponds to the domain structure obtained after AC polarization.

According to the method of manufacturing an ultrasonic probe according to this embodiment, it is possible to manufacture an ultrasonic probe by using a piezoelectric transducer having a high dielectric constant and a high piezoelectric constant. The sensitivity of the ultrasonic probe manufactured by the method of manufacturing an ultrasonic probe according to the embodiment or of the ultrasonic probe according to the embodiment improves as compared with an ultrasonic probe using a piezoelectric transducer polarized by DC polarization. Variations in characteristics (sensitivity and output) between the channels in the ultrasonic probe according to the embodiment are reduced as compared with an ultrasonic probe using a piezoelectric transducer polarized by DC polarization. In addition, the frequency band associated with the ultrasonic probe according to the embodiment is wider than that associated with an ultrasonic probe using a piezoelectric transducer polarized by DC polarization. Furthermore, since the dielectric loss decreases, the heat generated when the ultrasonic probe is driven decreases. For the above reasons, using the ultrasonic probe according to the embodiment can improve the diagnostic performance. Note that the use of the piezoelectric transducer according to the embodiment is not limited to the ultrasonic probe 100 according to Example 4. This piezoelectric transducer can be applied to, for example, a sonar, nondestructive inspection apparatus, actuator, and energy harvesting element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. An ultrasonic probe comprising:
a single crystal piezoelectric body including a first plane whose crystal orientation is [100] and a second plane which faces the first plane and whose crystal orientation is [100];

a first electrode on the first plane of the single crystal piezoelectric body and a second electrode on the second plane of the single crystal piezoelectric body;

an acoustic matching layer on the first electrode; and a backing member under the second electrode, wherein the single crystal piezoelectric body is polarized by alternating current and direct current along a first direction passing through the first electrode, the single crystal piezoelectric body and the second electrode, the alternating current is applied by an AC electric field, the direct current is applied by a DC electric field after application of the AC electric field, a fracture surface obtained by fracturing the single crystal piezoelectric body with a section parallel to the first direction includes concave/convex domains along one of the first electrode and the second electrode, alternating current polarization directions of adjacent concave/convex domains are different, and a thickness of each of the concave/convex domains is not less than 0.5 μm and not more than 5 μm.

2. The probe of claim 1, wherein the single crystal piezoelectric body comprises a lead complex perovskite compound.

3. The probe of claim 2, wherein the lead complex perovskite compound contains at least one of magnesium oxide and indium oxide and niobium oxide.

4. The probe of claim 1, wherein the thickness of the each of the concave/convex domain is not less than 0.5 μm and not more than 2 μm.

5. The probe of claim 2, wherein the lead complex perovskite compound contains v mol % of lead zirconate, x mol % of lead indium niobate, y mol % of lead magnesium niobate, and z mol % of lead titanate, where v=0 to 0.15, x=0.24 to 0.74, y=0 to 0.50, z=0.26 to 0.33, v+x+y=0.67 to 0.74, and v+x+y+z=1, and a phase transition temperature of a crystal structure of the lead complex perovskite compound is not less than 95° C. and not more than 150° C.

6. A piezoelectric transducer comprising:

a single crystal piezoelectric body comprising a lead complex perovskite compound containing at least one of magnesium oxide and indium oxide and niobium oxide and including a first plane whose crystal orientation is [100] and a second plane which faces the first plane and whose crystal orientation is [100]; and a first electrode on the first plane of the single crystal piezoelectric body and a second electrode on the second plane of the single crystal piezoelectric body, wherein the single crystal piezoelectric body is polarized by alternating current and direct current along a first direction passing through the first electrode, the single crystal piezoelectric body and the second electrode, the alternating current is applied by an AC electric field, the direct current is applied by a DC electric field after application of the AC electric field, a fracture surface obtained by fracturing the single crystal piezoelectric body with a section parallel to the first direction includes concave/convex domains along one of the first electrode and the second electrode, alternating current polarization directions of adjacent concave/convex domains are different, and a thickness of each of the concave/convex domains is not less than 0.5 μm and not more than 5 μm.

* * * * *